United States Patent
Yoda

(10) Patent No.: US 8,384,163 B2
(45) Date of Patent: Feb. 26, 2013

(54) LAYOUT DESIGN TOOL FOR SEMICONDUCTOR INTEGRATED CIRCUIT

(75) Inventor: Kenichi Yoda, Kawasaki (JP)

(73) Assignee: Renesas Electronics Corporation, Kanagawa (JP)

(*) Notice: Subject to any disclaimer, the term of this patent is extended or adjusted under 35 U.S.C. 154(b) by 34 days.

(21) Appl. No.: 13/006,659

(22) Filed: Jan. 14, 2011

(65) Prior Publication Data

US 2011/0113391 A1 May 12, 2011

Related U.S. Application Data

(62) Division of application No. 11/591,550, filed on Nov. 2, 2006, now Pat. No. 7,884,426.

(30) Foreign Application Priority Data

Nov. 17, 2005 (JP) ................................. 2005-332885

(51) Int. Cl.
  *H01L 27/092* (2006.01)
  *H01L 21/70* (2006.01)
  *H01L 27/088* (2006.01)
  *H01L 29/02* (2006.01)
  *H01L 27/118* (2006.01)

(52) U.S. Cl. ........ 257/401; 257/371; 257/376; 257/487; 257/547; 257/E27.067

(58) Field of Classification Search ............... 257/371, 257/376, 401, 487, 547, E27.067
See application file for complete search history.

(56) References Cited

U.S. PATENT DOCUMENTS

| | | | |
|---|---|---|---|
| 5,708,290 | A | 1/1998 | Cacciola et al. |
| 5,796,147 | A | 8/1998 | Ono |
| 5,912,495 | A | 6/1999 | Depetro et al. |
| 6,029,963 | A | 2/2000 | Saeki |
| 6,212,671 | B1 | 4/2001 | Kanehira et al. |
| 6,320,234 | B1 | 11/2001 | Karasawa et al. |
| 6,340,825 | B1 | 1/2002 | Shibata et al. |
| 6,388,295 | B1 | 5/2002 | Yamashita et al. |
| 6,501,138 | B1 | 12/2002 | Karasawa |
| 6,768,182 | B2 | 7/2004 | Oyamatsu |
| 7,091,079 | B2 | 8/2006 | Chen et al. |
| 7,525,172 | B2 | 4/2009 | Uchida |

(Continued)

FOREIGN PATENT DOCUMENTS

| | | |
|---|---|---|
| CN | 1114953 C | 7/2003 |
| CN | 101147147 A | 3/2008 |

(Continued)

OTHER PUBLICATIONS

Chinese Office Action in corresponding application, dated Mar. 27, 2009 (including an English translation thereof), 13 pages.

*Primary Examiner* — Teresa M Arroyo
(74) *Attorney, Agent, or Firm* — Foley & Lardner LLP

(57) ABSTRACT

Design time (TAT) is reduced in a layout design of a semiconductor integrated circuit having a well supplied with a potential different from a substrate potential. A layout design method of the present invention includes preparing a first cell pattern placed on a semiconductor substrate of a first conductive type, preparing a second cell pattern having a deep well of a second conductive type, placing the first cell pattern in a first circuit region, and placing the second cell pattern in a second region different from the first circuit region. This reduces TAT in chip design.

2 Claims, 8 Drawing Sheets

U.S. PATENT DOCUMENTS

| | | |
|---|---|---|
| 2002/0135022 A1 | 9/2002 | Igaue et al. |
| 2002/0137281 A1 | 9/2002 | Watanabe et al. |
| 2004/0026743 A1 | 2/2004 | Shibata et al. |
| 2004/0259318 A1 | 12/2004 | Williams et al. |
| 2006/0006462 A1 | 1/2006 | Chang et al. |
| 2006/0076575 A1 | 4/2006 | Masuoka |
| 2007/0132033 A1 | 6/2007 | Wu et al. |
| 2009/0067219 A1 | 3/2009 | Asayama |

FOREIGN PATENT DOCUMENTS

| | | |
|---|---|---|
| JP | 11-126827 A | 5/1999 |
| JP | 11-191593 | 7/1999 |
| JP | 2006-269787 A | 10/2006 |
| WO | WO 2006/100795 A1 | 9/2006 |

LAYOUT DESIGN TOOL FOR SEMICONDUCTOR INTEGRATED CIRCUIT

CROSS-REFERENCE TO RELATED PATENT APPLICATIONS

This application is a divisional of application Ser. No. 11/591,550, filed Nov. 2, 2006, now pending, which claims the benefit of priority from the prior Japanese Patent Application No. 2005-332885, filed Nov. 17, 2005, the entire contents of which are incorporated herein by reference. This application claims only subject matter disclosed in the parent application and therefore presents no new matter.

BACKGROUND OF THE INVENTION

1. Field of the Invention

The present invention relates to a layout design method of a semiconductor integrated circuit and a layout design tool of a semiconductor integrated circuit.

2. Description of Related Art

A demand for high performance, downsizing, and lower power consumption in a semiconductor integrated circuit including LSI (Large Scale Integration) which uses MOS (Metal Oxide Semiconductor) transistor has been increasing in recent years in order to achieve advanced data processing. However, a process technology for a semiconductor integrated circuit becomes narrower in order to achieve the high performance and the downsizing, a driving voltage for a semiconductor integrated circuit becomes lower. Accordingly a threshold voltage of a transistor decreases and a leak current in off state of a transistor increases. Consequently it is difficult to reduce the power consumption of a semiconductor integrated circuit.

To resolve this problem, there is known a method that forms a well region that is electrically separated from a semiconductor substrate, sets a potential of the well region different from a potential of a substrate, and increases a threshold voltage superficially. However separating a well potential in this way brings the following issue. To form a P well of a different potential from a substrate potential in a P type semiconductor substrate, an N well needs to be formed in a P type substrate and further a P well needs to be formed in the N well. Accordingly a region where a devices are formed in a substrate and a region (a separating well region) where devices are formed in a well that is electrically separated from the substrate are formed in the semiconductor substrate.

A method of forming a separating well region in the abovementioned way is disclosed in Japanese Unexamined Patent Application Publication No. 11-191593. FIG. 10 is a schematic view showing a semiconductor integrated circuit disclosed in Japanese Unexamined Patent Application Publication No. 11-191593. As shown in FIG. 10, a P well 302a and an N well 304a are electrically separated from a P type substrate by N type well separating regions 308a and 308b. A potential supplied to the P type substrate and a potential supplied to the P well 302b formed over the P type substrate are different. As described in the foregoing, the P well 302a and the N well 304a can be treated as separating regions. A method of automatically forming a mask pattern data of a semiconductor integrated circuit is disclosed in Japanese Unexamined Patent Application Publication No. 11-191593. This reduces design time and also improves design quality.

FIG. 11 is a flow chart showing a layout design of a semiconductor integrated circuit according to Japanese Unexamined Patent Application Publication No. 11-191593. Firstly a region where a basic cell is placed to be is specified using wafer process information 1, IC logic information 2, and cell/core information 3 that is input to a layout design tool (ST1). A cell is comprised of MOS transistors. Further, a cell is a basic element to form a semiconductor integrated circuit. A basic cell refers to a cell placed in a region having the same potential as of a substrate potential.

After that, the basic cell is automatically placed in ST2. And then, basic cell is automatically wired to another basic cell so as to form a circuit in ST3. In ST4, a well separating region is placed around a cell in a separating well region and a wiring connection for power supply is automatically generated. Lastly, the layout is verified in ST5.

However, there is a latter mentioned problem in designing a semiconductor integrated circuit having a separating well region using a flow shown in FIG. 10. The problem is that the method conducts a process of ST4 separately from a process of ST1 to ST3. Thus another process is required to form the separating well region and to connect a power supply of the separating well region.

Further, an interval between basic cells placed in the substrate potential region and the separating well region inserted later may not satisfy a design standard. In such case, the semiconductor integrated circuit needs to be redesigned. This increases processes and design time. Further, to insert a separating well region later, a design process of a semiconductor integrated circuit is complicated. This will require a skilled designer and also could deteriorate design quality due to design error.

Moreover, the step ST4 is not needed in a case using the flow chart of FIG. 10 for designing a semiconductor integrated circuit that does not have the separating well region. Accordingly this creates design time more than necessary.

SUMMARY OF THE INVENTION

According to an aspect of the present invention, there is provided a layout method of a semiconductor integrated circuit which comprises preparing a first cell pattern having a first transistor, preparing a second cell pattern having a second transistor and a deep well below the second transistor, placing the first cell pattern in a region to be a substrate potential region of a semiconductor substrate, and placing the second cell pattern in a region to be a separating well region of the semiconductor substrate.

According to another aspect of the present invention, there is provided a layout method of a semiconductor integrated circuit which comprises preparing a first cell pattern having a first transistor, preparing a second cell pattern having a second transistor and a deep well below the second transistor, placing the first cell pattern in a first circuit region of a semiconductor substrate, and placing the second cell pattern in a second circuit region of the semiconductor substrate, wherein the second circuit region has a potential different from the potential of the first circuit region.

A layout design for a region separated from the substrate potential is achieved in the same process by using the second cell pattern. Thereby TAT (Turn around Time) for designing chips is reduced.

According to another aspect of the present invention, there is provided a layout design tool of a semiconductor integrated circuit which comprises a pattern storage unit that stores a first cell pattern having a first transistor and a second cell pattern having a second transistor and a deep well below the second transistor, and a pattern layout unit for placing the first cell pattern in a region to be a substrate potential region of a semiconductor substrate and placing the second cell pattern in a region to be a separating well region of the semiconductor substrate.

This enables to form the region separated from the substrate potential by just placing the second cell pattern stored in advance. Thereby chip design becomes easier and also design quality becomes improved.

The abovementioned configuration reduces layout design time and also improve layout design quality for achieving a high performance, downsized, and low power consuming semiconductor integrated circuit.

BRIEF DESCRIPTION OF THE DRAWING

The above and other objects, advantages and features of the present invention will be more apparent from the following description taken in conjunction with the accompanying drawings, in which.

DESCRIPTION OF THE PREFERRED EMBODIMENTS

Figure 1:
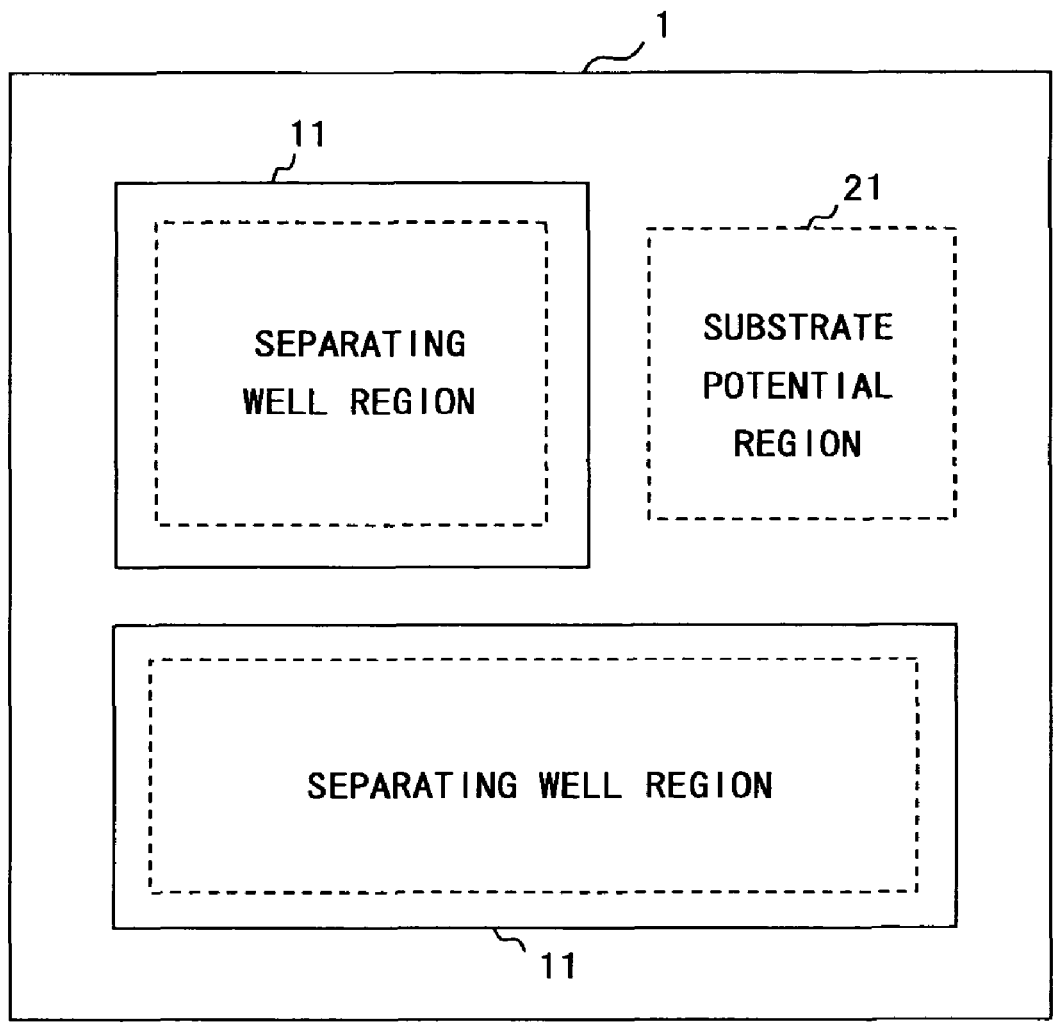
FIG. 1 is a simplified plan view showing a semiconductor integrated circuit according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

A preferred embodiment of the present invention is explained hereinafter in detail. The drawings are simplified as appropriate for clarity. Note that the same components are denoted by the same reference numerals and repetitive description will be omitted.

A first embodiment of the present invention is described hereinafter with reference to the drawings. FIG. 1 is a plan view showing a simplified layout of a semiconductor integrated circuit according to this embodiment. As shown in FIG. 1, a plurality of regions 11 that separates a substrate potential (hereinafter referred to as a separating well region 11) and a region 21 that does not separate the substrate potential (hereinafter referred to as a substrate potential region 21) are formed in a semiconductor integrated circuit 1.

Figure 2A:
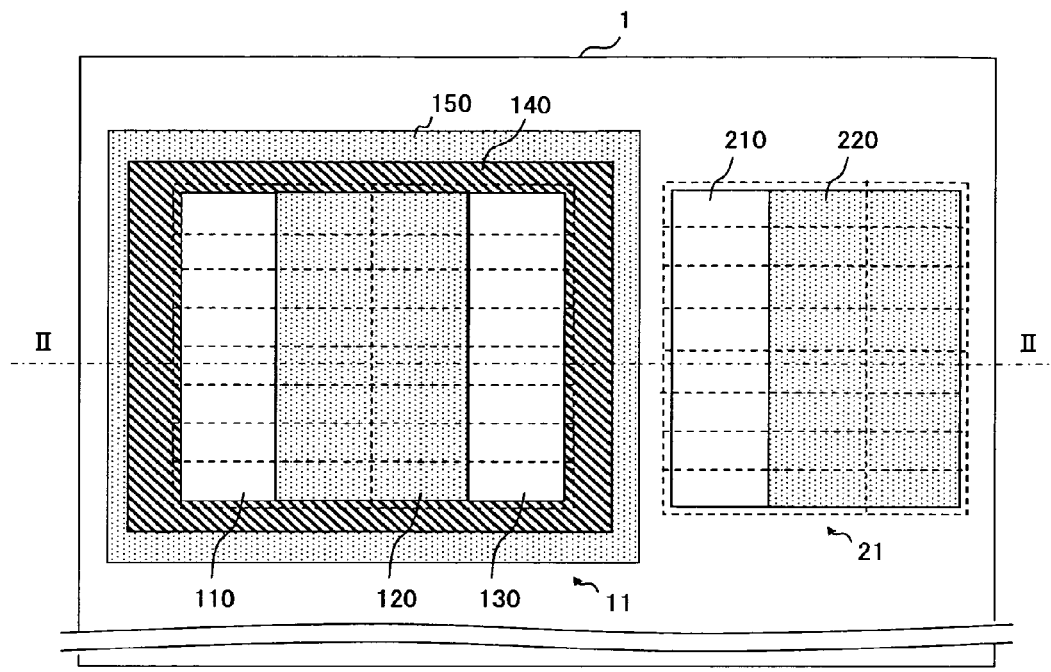
FIGS. 2A and 2B are a schematic plan view and a cross-sectional view showing a separating well region and a substrate potential region according to an embodiment of the present invention.
Figure 2B:
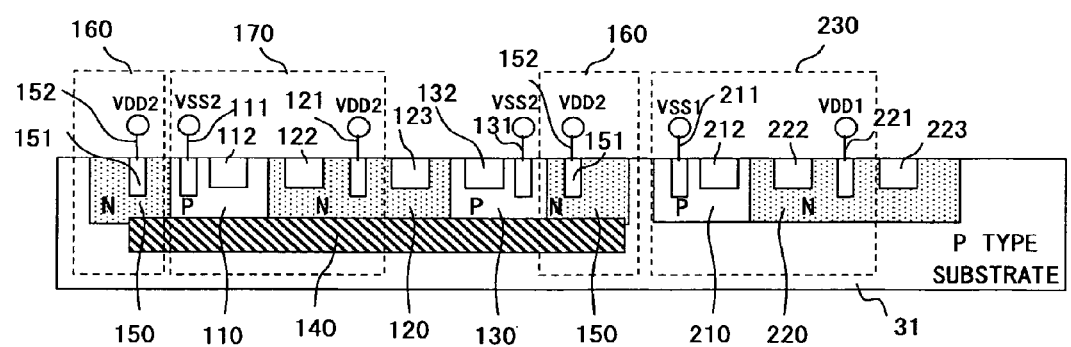

FIG. 2A is a schematic plan view showing the separating well region 11 and the substrate potential region 21. FIG. 2B is a cross-sectional diagram taken along the line II-II of FIG. 2A. As shown in FIG. 2B, P type well regions (hereinafter referred to as P wells) 110 and 130, and an N type well region (hereinafter referred to as an N well) 120 are placed successively and leaving no interval in the separating well region 11 of P type semiconductor substrate (hereinafter referred to as a P type substrate) 31.

Ground wires 111 and 131 formed in the separating well region 11 are electrically connected to the P wells 110 and 130 respectively. And a ground potential is supplied to the P wells 110 and 130. A power wire 121 is electrically connected to a surface of the N well 120. A power supply potential is supplied to the N well 120. The P and N wells are apposed in the separating well region at a regular interval. The numbers of the P and N wells being placed is not limited to the numbers shown in FIGS. 2A and 2B. The numbers of the P and N wells differs depending on a function of a semiconductor integrated circuit.

FIGS. 2A and 2B is a simplified view for understanding a physical relationship of the separating well region 11. As shown in FIG. 2A, an N type well region (hereinafter referred to as a deep N well 140) is placed below the entire region of the P wells 110 and 130, and the N well 120. The P wells 110 and 130, and the N well 120 are placed in the separating well region 11. Further as shown in FIG. 2B, an N type well region (hereinafter referred to as an N well wall 150) that extends from a surface of the P type substrate 31 to the deep N well 140 is placed. The N well wall 150 is placed outside a region where the P wells 110 and 130, and the N well 120 are formed.

A power wire 152 is electrically connected to a surface of the N well wall 150. A power supply potential is supplied to the N well wall 150 by a contact region 151. In case the power supply potential is applied to the power wire 152 and the grounding potential is applied to the P type substrate 31, a PN junction between the deep N well 140 and the P type substrate 31 and a PN junction between the N well wall 150 and the P type substrate 31 will be biased reversely. Accordingly the deep N well 140 and the N well wall 150 function as a electrically separating region against the P type substrate 31. Consequently the P wells 110 and 130 in the separating well region 11 are electrically separated from the P type substrate 11.

On the other hand, a P well 210 and an N well 220 are consecutively placed in the substrate potential region 21 of the P type substrate 31. A ground wire 211 is electrically connected to the P well 210 that is formed over a surface of the substrate potential region 21. A ground potential is supplied to the P well 210. Further, a power wire 221 is electrically connected to a surface of the N well 220. The power supply potential is supplied to the N well 220. The P and N wells are apposed over the substrate potential region 21 at a regular interval. The numbers of the P and N wells being placed is not limited to the number shown in FIGS. 2A and 2B. The numbers of the P and N wells differs depending on a function of a semiconductor integrated circuit. FIGS. 2A and 2B are simplified views for understanding a physical relationship of the substrate potential region 21.

In the substrate potential region 21, a substrate potential of the P type substrate 31 is electrically connected with the P well 210. Accordingly, if a potential is supplied to the P well 210, the P well in the substrate potential region 21 becomes the same potential as of the P type substrate 31. In the separating well region 11, the P wells 110 and 130 are separated from the substrate potential of the P type substrate 31 by the deep N well 140 and the N well wall 150. Accordingly a potential different from the substrate potential of the P type substrate 31 is supplied to the P wells 110 and 130 formed in the separating well region 11.

Figure 3A:
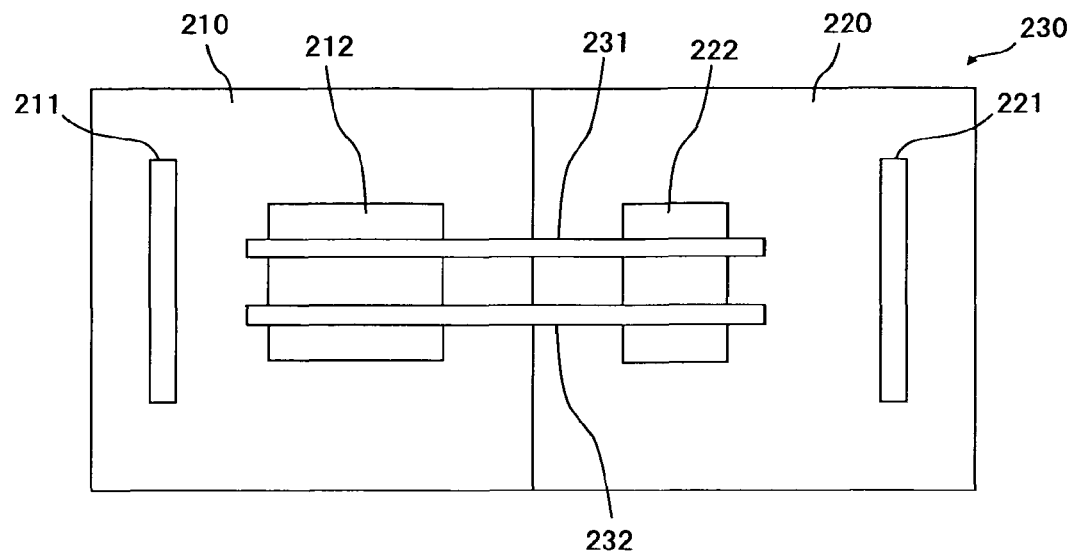
FIGS. 3A and 3B are plan views showing a cell pattern of a semiconductor integrated circuit according to an embodiment of the present invention.
Figure 3B:
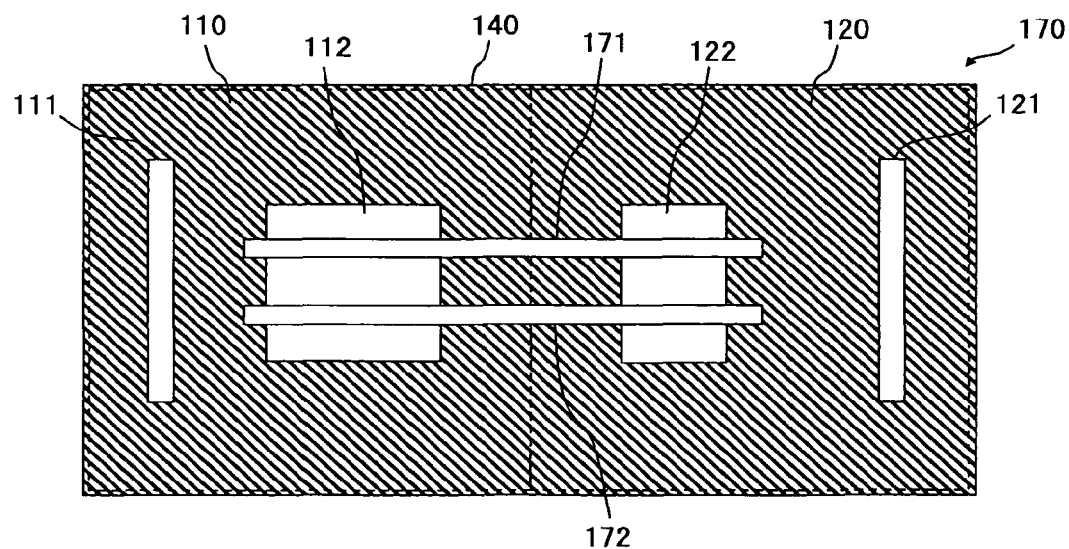
Figure 4A:
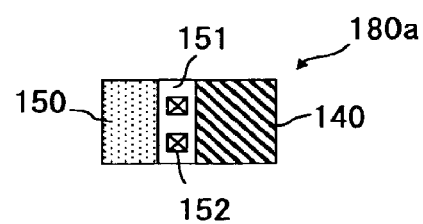
FIGS. 4A to 4D are plan views showing a cell pattern placed around a separating well region.
Figure 4B:
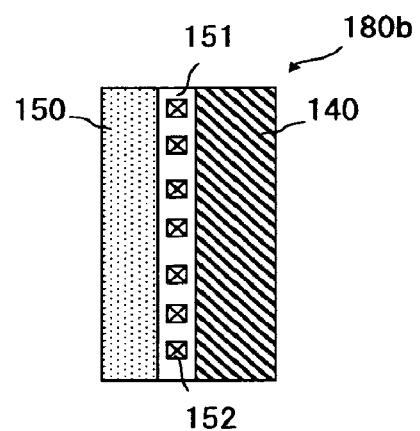
Figure 4C:
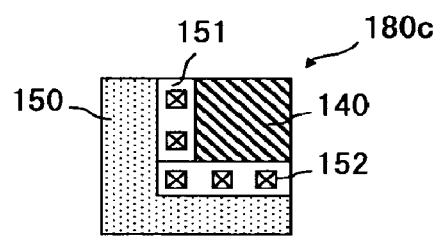
Figure 4D:
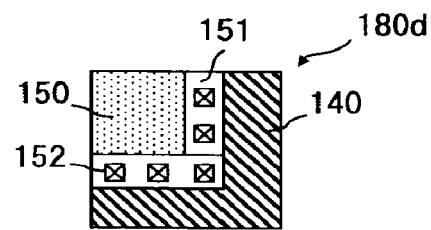

FIGS. 3A and 3B are plan views showing a cell pattern of a semiconductor integrated circuit according to this embodiment. FIG. 3A is a cell pattern placed in the substrate potential region 21 (hereinafter referred to as a basic cell 230). The basic cell 230 is a cell region corresponds to 230 in FIG. 2B, for example. The basic cell 230 is comprised of CMOS transistors. CMOS transistors are formed by NMOS transistor formed in an N type diffusion region 212 of the P well 210 and a PMOS transistor formed in a P type diffusion region 222 of the N well 220.

The basic cell 230 is a basic element forming the semiconductor integrated circuit 1. The substrate potential region 21 is formed by combining a plurality of the basic cells 230.

FIG. 3B is a cell pattern placed in the separating well region 11 (hereinafter referred to as a cell for separating region 170). The cell for separating region 170 is a cell region corresponds to 170 in FIG. 2B, for example. The cell for separating region 170 includes the deep N well 140 added below an entire surface of the basic cell 230. The CMOS transistors having the NMOS transistor formed in the N type diffusion region 112 of the P well 110 and the PMOS transistor formed in the P type diffusion region 122 of the N well 120 are placed over the deep N well 140.

Figure 5:
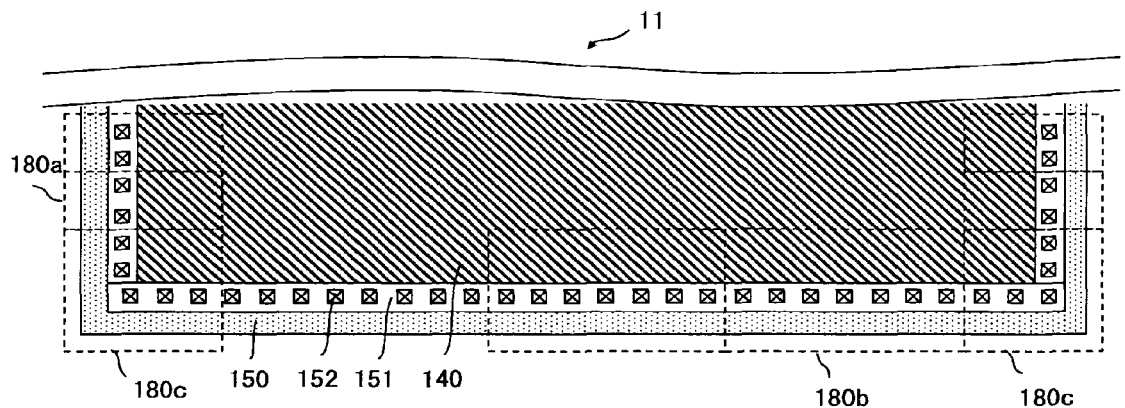
FIG. 5 is a plan view showing a usage example of a cell pattern placed around a separating well region.

FIGS. 4A to 4D are plan views showing a cell pattern placed around the separating well region 11 (hereinafter referred to as a cell for peripheral part 180). FIG. 5 is a plan view showing an example of a layout of the cell for peripheral part 180. FIG. 5 is a view showing the separating well region 11 of the semiconductor integrated circuit 1. The cell for peripheral part is described hereinafter with reference to FIGS. 4A to 4D and 5.

The deep N well 140, the N well wall 150, the contact region 151, and the power line 152 for supplying the substrate potential are formed in the cell for peripheral part 180. The cell for peripheral part 180 is a cell region corresponds to 160 shown in FIGS. 2A and 2B. Note that 160 of FIGS. 2A and 2B is a well separating region. By placing the cell for peripheral part 180 adjacent to the separating well region 11, the P wells 110 and 130 are separated from the P type substrate 31.

As shown in FIG. 5, the cell for peripheral part 180 is placed around the separating well region 11. The cell for peripheral part 180 separates the separating well region 11 from the substrate potential region 21 in the semiconductor integrated circuit 1. The cell for peripheral part 180 will be placed as follow, for example. Either of short cell 180a and long cell 180b is placed to straight portions of the outer periphery of the separating well region 11. Further, either of cell 180c and cell 180d (not shown in FIG. 5) is placed at corner portions of the separating well region 11.

Figure 6:
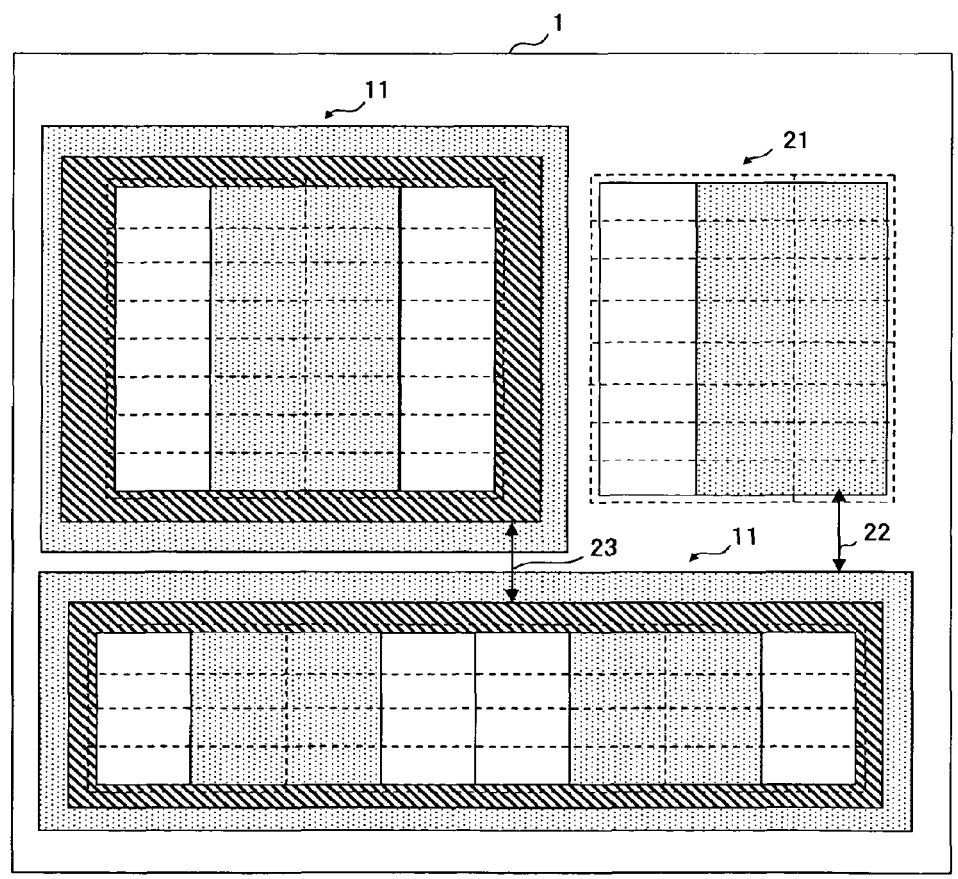
FIG. 6 is a plan view showing a restriction for space in placing cells around a separating well region.

Next, a interval space between the cell for peripheral part 180 and the well regions placed adjacent will be described hereinafter in detail with reference to FIG. 6. As shown in FIG. 6, the separating well region 11 lie adjacent to the substrate potential region 21, and a specified space 22 is provided between the N well wall 150 and the N well placed to the substrate potential region 21 side. This is because that in case a potential differs between the N well wall 150 and the N well, they may be shorted. Accordingly a cell size of the cell for peripheral part 180 is determined to satisfy the abovementioned specified space.

Similarly, in case the separating well regions 11 are placed adjacent to each other, a specified space 23 is provided between the deep N wells 140 of the separating well regions 11. This is because that the adjacent separating well regions may have different potentials. Accordingly a cell size of the cell for peripheral part 180 is determined to satisfy the abovementioned specified space.

In this embodiment, the cell for separating region 170 and the cell for peripheral part 180 are prepared. Further, different cells for peripheral part 180 are prepared. These are used in a layout design of the semiconductor integrated circuit 1 having he separating well region 11. A layout design tool 2 such as an automatic wiring apparatus may be used for the layout design.

Figure 7:
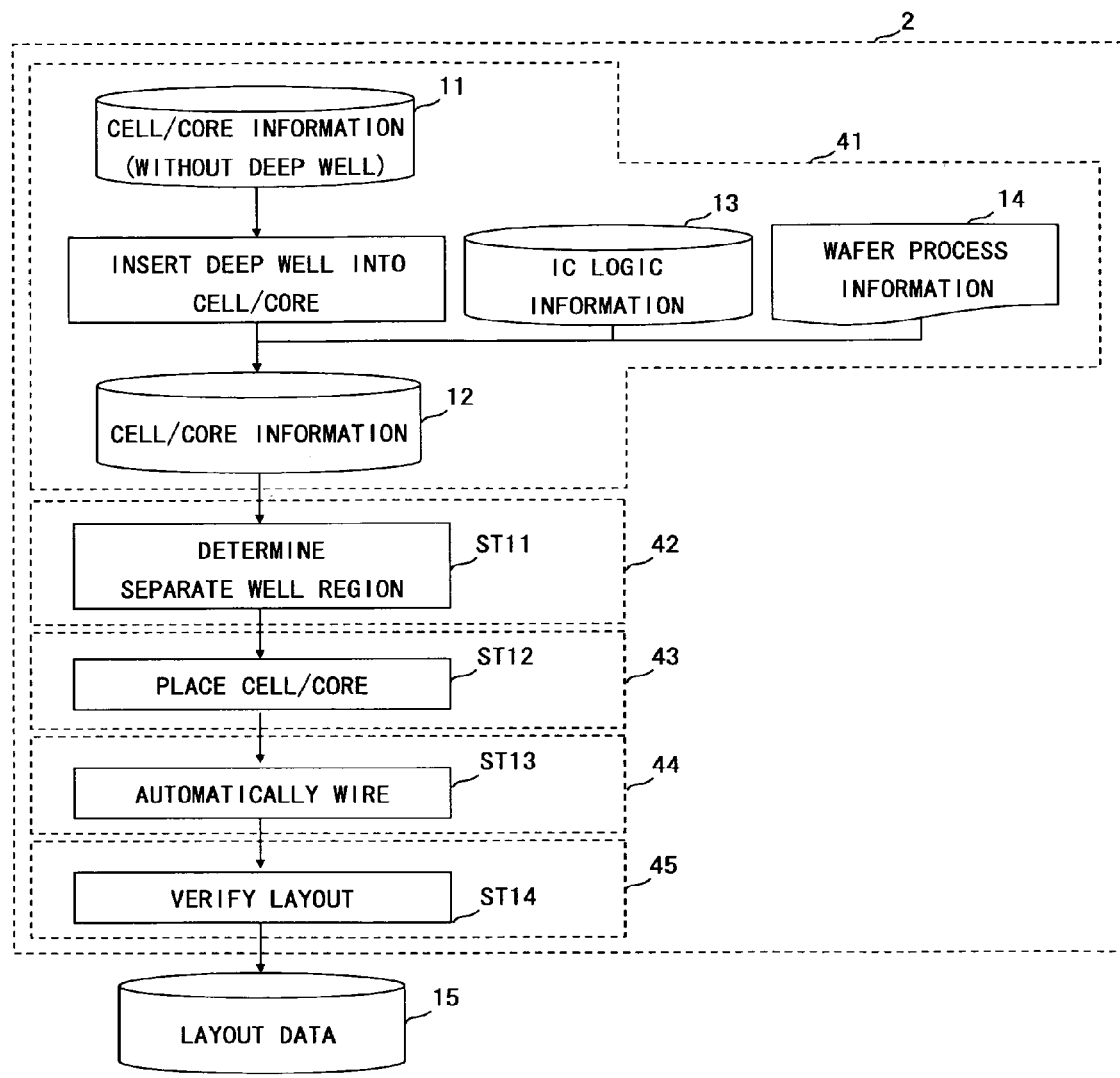
FIG. 7 is a view showing a layout design tool and a flow chart of layout design according to an embodiment of the present invention.

FIG. 7 shows a layout design tool and a layout design flowchart according to this embodiment. The layout design tool 2 is comprised of a pattern storage unit 41, a region specifying unit 42, a pattern layout unit 43, a wiring unit 44, and a verifying unit 45. The layout design tool 2 is input with design information of the semiconductor integrated circuit from an input unit (not shown), and layout data is output from an output unit (not shown).

Cell pattern, core module information, logic information 13 of a semiconductor integrated circuit, and wafer process information 14 that is specified by a user is registered to the pattern storage unit 41 in advance. Core module here indicates a general CPU (Central Processing Unit), an interface unit, a ROM (Read Only Memory)/RAM (Random Access Memory), and a computing unit etc.

Normally in a pattern storage unit of a general layout design tool, cell information of the basic cell 230 without separating region and core module information (cell information/core information 11 without separating region) is registered. In the pattern storage unit 41 of the layout design tool 2 of this embodiment, the cell/core information 12 is stored. The cell/core information 12 is the cell/core information 11 inserted with information of the deep N well 140 and the N well wall 150 without the separating region. The cell information 12 is for example cell information having the basic cell 230 inserted with the deep N well 140 and N well wall 150. The core information 12 is general core module information inserted with the deep N well 140.

Figure 8:
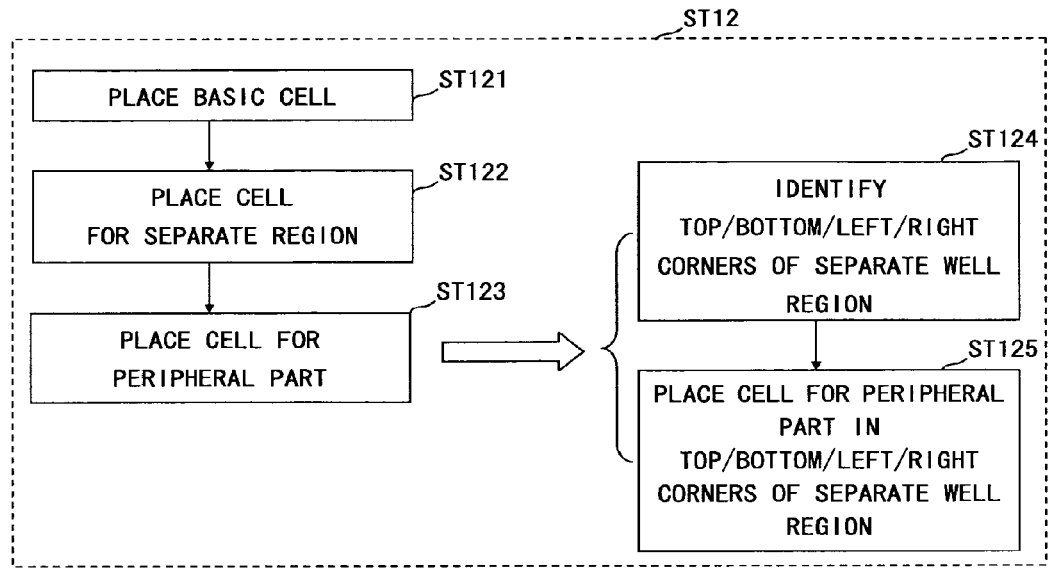
FIG. 8 is a flow chart detailing a step ST12 of FIG. 7.

In this embodiment, a layout is designed based on the above information. A flow of layout design is described hereinafter with reference to FIG. 7. FIG. 8 is a flow detailing the step ST12 of FIG. 7.

Firstly a layout of the separating well region 11 and the substrate potential region 21 is determined in ST11. This is performed by the region specifying unit 42 of a layout design tool 2. In this process, functions of the semiconductor integrated circuit are hierarchized and layouts of functional group are input manually. This process determines a layout of a semiconductor chip as shown in FIG. 1.

Then in ST12, a cell and a core module are placed at regions determined by ST11. That is, pattern information of cell/core information 11 and 12 that is provided to the layout design tool in advance is automatically placed according to the logic information 13 of the semiconductor integrated circuit and the wafer process information 14. This is performed by a pattern layout unit 43 of the layout design tool 2. In this process, cell and core modules are placed regardless of the separating well region 11 and the substrate potential region 21. An example of a flow in ST12 is described hereinafter in detail with reference to FIG. 8.

As shown in FIG. 8, in ST12, firstly the basic cell 230 is placed in ST121. Then, the cell for separating region 170 is placed in ST122. The substrate potential region 21 is formed in the region where the basic cell 230 is placed. The separating well region 11 is formed in the region where the cell for separating region 170 is formed.

Figure 9:
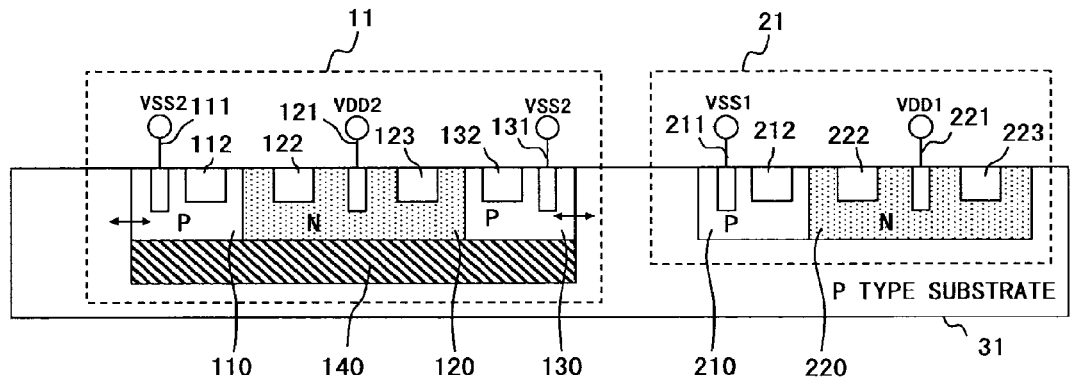
FIG. 9 is a cross-sectional diagram showing a state of the step ST12 in a layout design flow according to an embodiment of the present invention.
Figure 10:
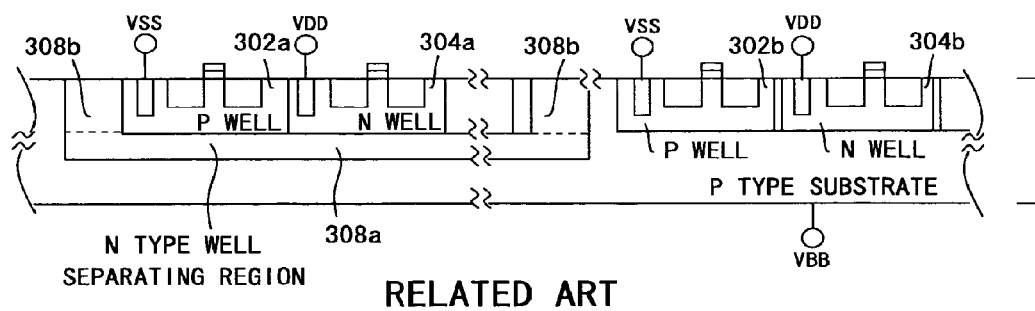
FIG. 10 is a cross-sectional diagram showing a semiconductor integrated circuit according to a conventional technique.
Figure 11:
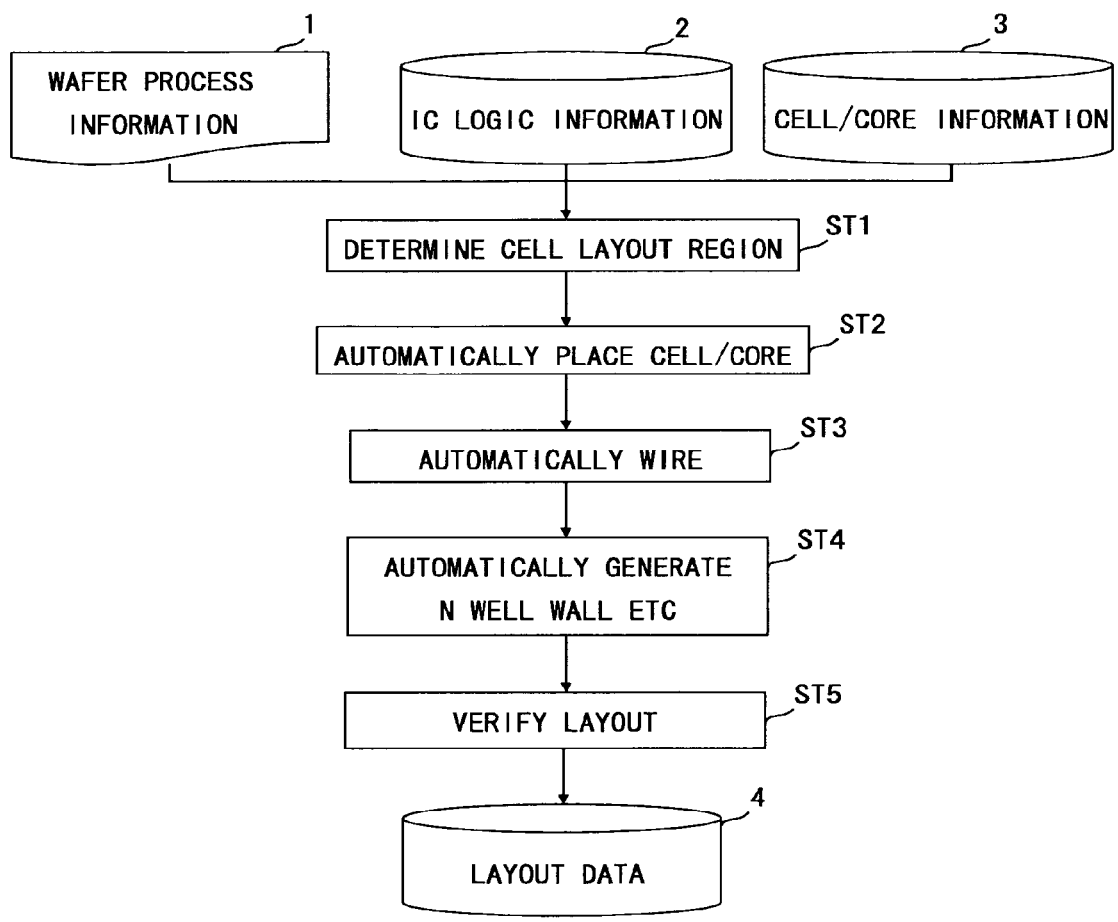
FIG. 11 is a flow chart showing a layout design of a semiconductor integrated circuit according to a conventional technique.

However at this time, it is formed as shown in FIG. 9 because the cell for peripheral part 180 is not placed. In FIG. 9, the P wells 110 and 130 placed in the separating well region 11 and the P type substrate 31 short because the N well wall 150 is not placed.

Then, the cell for peripheral part 180 is placed around the separating well region 11 in ST123. This forms a region having a separate substrate potential from the P type substrate 31 by a well separating region 160 as shown in FIG. 2B. This process is described in detail now on. Firstly straight and corner portions in an outer periphery of the separating well region 11 are identified (ST124). Then cells for peripheral part 180a, 180b, 180c, and 180d are placed correspondingly which are stored to the pattern storage unit 41 of the layout design tool 2 (ST125). In this way, the separating well region 11 is formed.

An order of placing the basic cell 230 (ST121), the cell for separating region 170 (ST122), and the cell for peripheral part 180 (ST123) is not limited to the order described above.

Then, cell and core modules being placed are automatically wired in ST13. This is performed by a wiring unit 44 of the layout design tool 2. Lines are connected at the same time among elements of the basic cell 230, the cell for separating region 170, the cell for peripheral part 180, and other core modules. A plurality of sorts of line connecting cells are registered to the layout design tool 2. Shapes of the cells differ depending on a position to be placed. The line connecting cells may be used to automatically wire as described above.

Lastly in ST14, the layout design tool 2 verifies layout data of the semiconductor integrated circuit 1 according to a design standard. Layout data is obtained at this time. This is performed by the verifying unit 45 of the layout design tool 2. The obtained layout data is output from the output unit.

In the flow shown in FIG. 7, data is input manually from the input unit of the layout design tool 2. Then in ST12 and ST13, the circuit is automatically designed by the layout design tool 2. In ST14, the circuit is automatically verified by the layout design tool.

As described in the foregoing, by storing the cell for separating region 170 and the cell for peripheral part 180 in the pattern storage unit 41 of the layout design tool 2, a region having a separate substrate potential can be formed simultaneously with cell layout. This indicates that the separating well region 11 and the substrate potential region 21 are formed in the same process, thereby reducing TAT in chip design.

The cell for peripheral part 180 stored to the layout design tool is designed to satisfy the space between adjacent wells. Accordingly the space between adjacent well do not need to be verified after placing the cell for peripheral part 180. That is, the space between the separating well region 11 and the substrate potential region 21 will not be unsatisfactory, thereby not needing a redesigning. This consequently eliminates the time for designing layout of the semiconductor integrated circuit 1 and tracking back the design. Thus TAT can be reduced.

Moreover, a layout can be designed without considering a design standard for the cells placed in the separating well region 11 and the cells placed in other regions. Thus a mask pattern can easily be formed. Accordingly the design can be standardized and design quality can be improved because pattern composer is not limited. Having less possibility for design error reduces failure after manufactured.

It is apparent that the present invention is not limited to the above embodiment and it may be modified and changed without departing from the scope and spirit of the invention.

What is claimed is:

1. A layout design tool comprising:
a pattern storage that stores first to third cell patterns, the first cell pattern having both first n-type and p-type transistors, the second cell pattern having both second n-type and p-type transistors and a deep well below the second n-type and p-type transistors, and the third cell pattern having a cell layout including a well wall that reaches the deep well from a surface of a semiconductor substrate; and
a pattern layout unit configured to provide a pattern layout by placing the first and second cell patterns on the semiconductor substrate, placing the first cell pattern in a substrate potential region of the semiconductor substrate, placing the second cell pattern in a plurality of separating well regions of the semiconductor substrate, and placing the third cell pattern in a peripheral region peripheral to the plurality of separating well regions of the semiconductor substrate, wherein
the third cell pattern is configured such that a space between at least one of the plurality of separating well regions and the substrate potential region or at least one of the plurality of separating well regions and another of the plurality of separating well regions is formed,
wherein the separating well regions have a potential different from the potential of the substrate potential region.

2. A layout design tool comprising:
means for storing first to third cell patterns; and
means for providing a pattern layout comprising:
means for placing the first cell pattern, which has both first n-type and p-type transistors, on a semiconductor substrate;
means for placing the second cell pattern, which has both second n-type and p-type transistors and a deep well below the second n-type and p-type transistors, on the semiconductor substrate;
means for placing the first cell pattern in a substrate potential region of the semiconductor substrate;
means for placing the second cell pattern in a plurality of separating well regions of the semiconductor substrate; and
means for placing the third cell pattern, having a cell layout including a well wall that reaches the deep well from a surface of the semiconductor substrate, in a peripheral region peripheral to the plurality of separating well regions of the semiconductor substrate, wherein
the third cell pattern is configured such that a space between at least one of the plurality of separating well regions and the substrate potential region or at least one of the plurality of separating well regions and another of the plurality of separating well regions is formed,
wherein the separating well regions have a potential different from the potential of the substrate potential region.

* * * * *